(12) United States Patent
Wickramanayaka

(10) Patent No.: US 9,613,928 B2
(45) Date of Patent: Apr. 4, 2017

(54) METHOD AND APPARATUS FOR CHIP-TO-WAFER INTEGRATION

(71) Applicant: Agency for Science, Technology and Research, Singapore (SG)

(72) Inventor: Sunil Wickramanayaka, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 0 days.

(21) Appl. No.: 14/904,670

(22) PCT Filed: Jul. 16, 2014

(86) PCT No.: PCT/SG2014/000335
§ 371 (c)(1),
(2) Date: Jan. 12, 2016

(87) PCT Pub. No.: WO2015/009238
PCT Pub. Date: Jan. 22, 2015

(65) Prior Publication Data
US 2016/0155720 A1    Jun. 2, 2016

(30) Foreign Application Priority Data

Jul. 16, 2013    (SG) .................................. 201305439

(51) Int. Cl.
*H01L 21/44* (2006.01)
*H01L 21/48* (2006.01)
(Continued)

(52) U.S. Cl.
CPC ............ *H01L 24/83* (2013.01); *H01L 21/563* (2013.01); *H01L 24/743* (2013.01); *H01L 24/75* (2013.01); *H01L 24/81* (2013.01); *H01L 24/92* (2013.01); *H01L 24/94* (2013.01); *H01L 24/97* (2013.01); *H01L 25/50* (2013.01); *H01L 2224/13009* (2013.01); *H01L 2224/13147* (2013.01);
(Continued)

(58) Field of Classification Search
CPC    H01L 24/83; H01L 24/743; H01L 2224/8312
USPC ......................................... 438/108
See application file for complete search history.

(56) References Cited

U.S. PATENT DOCUMENTS

| 4,933,042 A | * | 6/1990 | Eichelberger | ........... H01L 21/56 |
| | | | | 156/239 |
| 5,352,629 A | * | 10/1994 | Paik | ........... H01L 23/13 |
| | | | | 228/123.1 |
| 5,605,547 A | * | 2/1997 | Lake | ........... H01L 21/568 |
| | | | | 257/E21.511 |

OTHER PUBLICATIONS

International Search Report for PCT/SG2014/000335, 4 pages (Oct. 3, 2014).

* cited by examiner

*Primary Examiner* — David S Blum
(74) *Attorney, Agent, or Firm* — Choate, Hall & Stewart LLP; Charles E. Lyon

(57) ABSTRACT

An apparatus and a method for chip-to-wafer integration is provided. The apparatus includes a coating module, a bonding module and a cleaning module. The method includes the steps of placing at least one chip on a wafer to form an integrated product, forming a film on the integrated product, such that the integrated product is substantially fluid-tight, and exerting a predetermined positive pressure on the film during permanent bonding of the at least one chip to the wafer. The method further includes the step of removing the film from the integrated product after permanent bonding of the at least one chip to the wafer.

18 Claims, 11 Drawing Sheets

(51) Int. Cl.
  *H01L 21/50* (2006.01)
  *H01L 23/00* (2006.01)
  *H01L 21/56* (2006.01)
  *H01L 25/00* (2006.01)
(52) U.S. Cl.
  CPC ........ *H01L 2224/16145* (2013.01); *H01L 2224/27515* (2013.01); *H01L 2224/2919* (2013.01); *H01L 2224/32145* (2013.01); *H01L 2224/73104* (2013.01); *H01L 2224/73204* (2013.01); *H01L 2224/7501* (2013.01); *H01L 2224/753* (2013.01); *H01L 2224/7511* (2013.01); *H01L 2224/7598* (2013.01); *H01L 2224/75102* (2013.01); *H01L 2224/75184* (2013.01); *H01L 2224/75264* (2013.01); *H01L 2224/81002* (2013.01); *H01L 2224/81093* (2013.01); *H01L 2224/81097* (2013.01); *H01L 2224/81193* (2013.01); *H01L 2224/81209* (2013.01); *H01L 2224/81903* (2013.01); *H01L 2224/81907* (2013.01); *H01L 2224/83002* (2013.01); *H01L 2224/8309* (2013.01); *H01L 2224/8312* (2013.01); *H01L 2224/83093* (2013.01); *H01L 2224/83097* (2013.01); *H01L 2224/83193* (2013.01); *H01L 2224/83209* (2013.01); *H01L 2224/83855* (2013.01); *H01L 2224/83856* (2013.01); *H01L 2224/83862* (2013.01); *H01L 2224/83907* (2013.01); *H01L 2224/83911* (2013.01); *H01L 2224/9205* (2013.01); *H01L 2224/9211* (2013.01); *H01L 2224/94* (2013.01); *H01L 2224/97* (2013.01); *H01L 2225/06513* (2013.01); *H01L 2225/06541* (2013.01); *H01L 2225/06593* (2013.01)

METHOD AND APPARATUS FOR CHIP-TO-WAFER INTEGRATION

PRIORITY CLAIM

The present application claims priority to Singapore Patent Application No. 201305439-0, filed on 16 Jul. 2013.

TECHNICAL FIELD

The present invention relates broadly to a method for chip-to-wafer integration.

BACKGROUND

Elemental metal-metal bonding is a solid-state diffusion bonding process and needs relatively long bonding time at an elevated temperature. For example, Cu—Cu diffusion bonding process takes about 30 min at more than 300° C. Chip-on-wafer bonding can be performed by metal-metal diffusion bonding between the chip and wafer. In view of the time-consuming bonding process, flip chip bonders are rarely used for chip-on-wafer bonding to minimise the cost involved.

Conventionally, chip-on-wafer bonding involves solder-assisted bonding. Solder-assisted bonding are carried out in a relatively short period of time, e.g. about 20 seconds. Solders are first aligned and heated to its melting point, followed by a bonding process. Metal-metal bonding with flip chip bonder alone is also not practical since metal-metal bonding is a diffusion-dominant bonding process which takes relatively more time, usually over 30 minutes. Here, two step bonding process appears to be feasible. In particular, a chip is first aligned and temporarily bonded to a wafer using a flip chip bonder followed by a permanent bonding process carried out by a conventional bonder. In particular, a chip is first aligned and temporarily bonded to a wafer using a flip chip bonder followed by a permanent bonding process carried out by a conventional bonder. The chip and wafer can be temporarily bonded using an adhesive, or thermosonic (ultrasonic) bonding. The adhesive may remain between chip and wafer after permanent bonding, or may vaporize during the permanent bonding. The temporary bonding process is usually carried out below 100° C. Again, the bonding time per chip is relatively short in contrast with permanent bonding as it only involves pressing the chip onto the wafer. Depending on the required accuracy of the alignment, the required time for temporary bonding varies. For example, if the target alignment accuracy is 3 μm (3σ), total bonding time can be within 3 seconds.

Upon completion of the temporary bonding process of all the chips on wafer, the product of the temporary bonding process is placed on a bottom stage of the conventional bonder. Subsequently, a top stage presses and applies force on the chips. Bottom and top stages are then heated to a suitable temperature for permanent bonding.

It has been noted that chips tend to get misaligned during the permanent bonding process as described above. For example, top stages and surfaces thereof may be made of material, e.g. stainless steel that have different coefficient of thermal expansion (CTE) than that of wafer. Non-uniform expansion of the top stage and the wafer may result in a horizontal force exerted on the chips.

Further, chips which are temporarily bonded on the wafer can have slightly different thicknesses. As illustrated in FIG. 1, when the top stage 102 presses and applies force on the chips 104, it is likely that thicker chips receive the force while chips with lower thickness do not receive sufficient bonding force thereby resulting in a non-uniform bonding force and poor bonding between some of the chips and wafer.

With reference to FIG. 2, in order to solve the issues of non-uniform bonding force and poor bonding, a soft plate 202 that is made of deformable material is typically placed between the chips 204 and a topside stage 206. As such, chips with different height may still receive sufficient force during permanent bonding. However, the deformation of the soft plate around the chips may generate a horizontal force component on the neighbouring chips, causing chips to misalign with the wafer.

A need therefore exists to provide a method for chip-to-wafer integration that seeks to address at least some of the problems above or to provide a useful alternative.

SUMMARY

In accordance with the Detailed Description, a method for chip-to-wafer integration is provided. The method includes the steps of placing at least one chip on a wafer to form an integrated product, forming a film on the integrated product, such that the integrated product is substantially fluid-tight, and exerting a predetermined positive pressure on the film during permanent bonding of the at least one chip to the wafer. The method further includes the step of removing the film from the integrated product after permanent bonding of the at least one chip to the wafer.

In accordance with a further embodiment, an apparatus for chip-to-wafer integration is provided. The apparatus includes a coating module, a bonding module and a cleaning module. The coating module forms a film on an integrated product, wherein the integrated product being formed by placing at least one chip to a wafer such that the integrated product is substantially fluid-tight. The bonding module exerts pressure on the film during permanent bonding of the at least one chip to the wafer. And the cleaning module removes the film from the integrated product.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
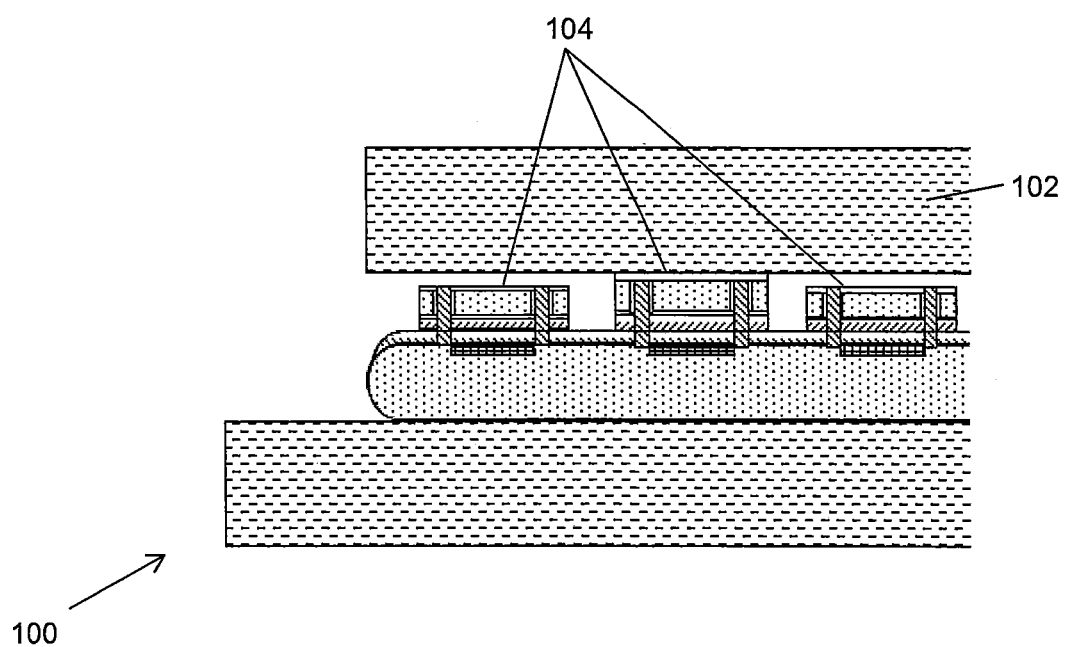
FIG. 1 shows a diagram illustrating a cross-sectional view of a chip-on-wafer when a top stage is pressed on the chips according to a first prior art.

FIG. 1 shows a diagram illustrating a cross-sectional view of a chip-on-wafer 100 when a top stage 102 is pressed on the chips 104 according to a first prior art.

Figure 2:
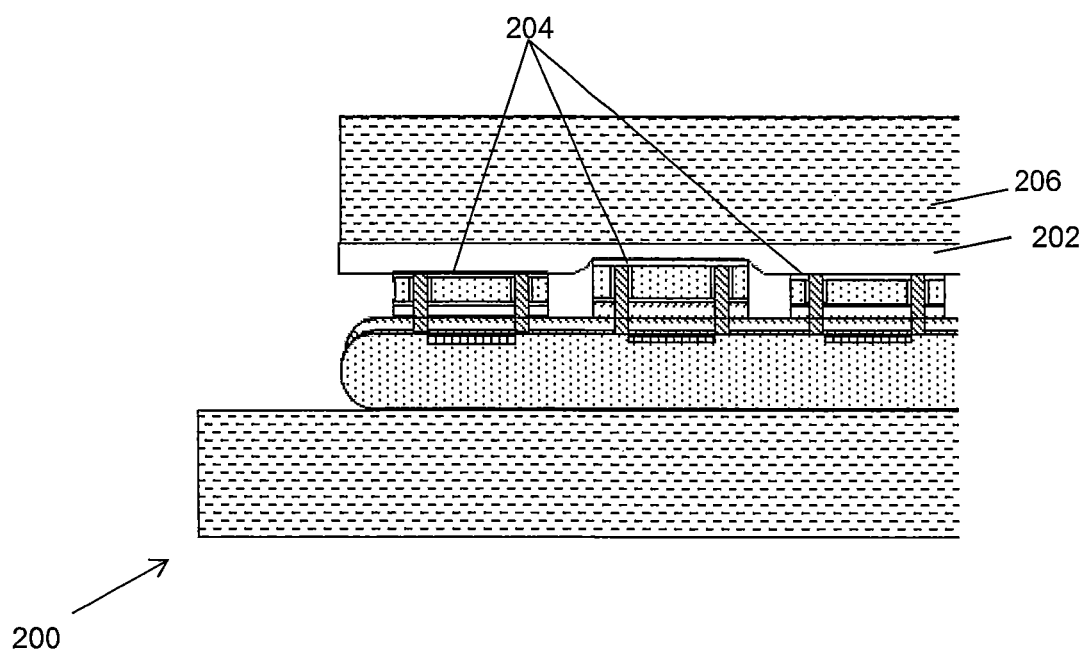
FIG. 2 shows a diagram illustrating a cross-sectional view of a chip-on-wafer when a top stage is pressed on the chips according to a second prior art.

FIG. 2 shows a diagram illustrating a cross-sectional view of a chip-on-wafer 200 when a top stage 206 is pressed on the chips 204 according to a second prior art.

Figure 3:
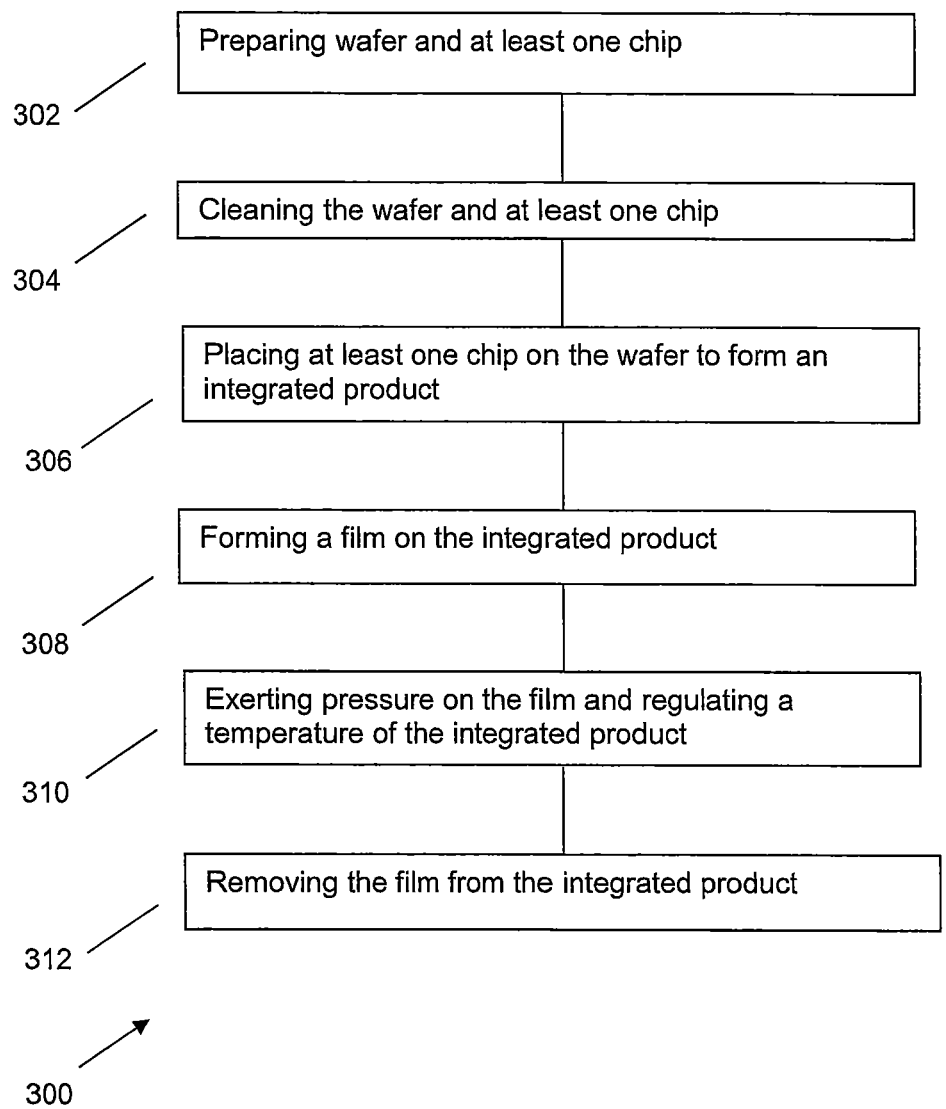
FIG. 3 shows a flow chart illustrating a method for chip-to-wafer integration according to an example embodiment.

FIG. 3 shows a flow chart 300 illustrating a method for chip-to-wafer integration according to an example embodiment. At step 302, a wafer and at least one chip are prepared. At step 304, the wafer and the at least one chip are cleaned. At step 306, the at least one chip is placed on the wafer, such that the at least one chip and the wafer form an integrated product. At step 308, a film is formed on the integrated product, such that the integrated product is substantially fluid-tight. At step 310, permanent bonding is carried out by exerting a predetermined positive pressure on the film and regulating a temperature of the integrated product. At step 312, the film is removed from the integrated product.

Figure 4A:
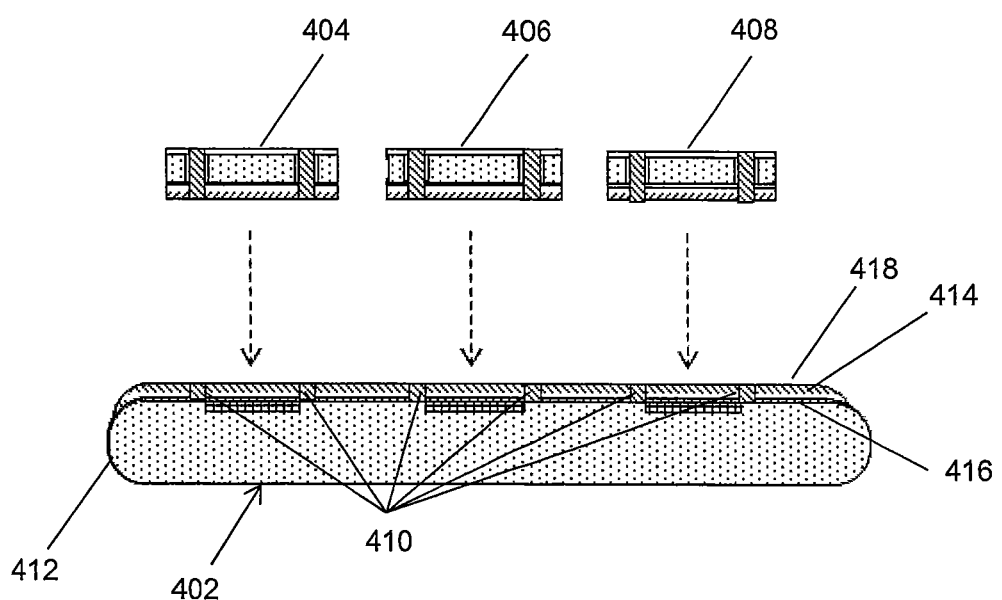
FIG. 4A shows a diagram illustrating a cross-sectional view of the at least one chip and wafer obtained from step 304 of FIG. 3 in accordance with the embodiment.

FIG. 4A shows a diagram illustrating a cross-sectional view of the at least one chip and wafer obtained from step 304 of FIG. 3 in accordance with the embodiment. At step 302, a wafer 402 and at least one chip, represented as chips 404, 406, 408 are prepared, as discussed above with respect to FIG. 3. The preparation of the wafer 402 and chips 404, 406, 408 are carried out by first forming a plurality of metal interconnects, schematically represented as metal interconnects 410, e.g. Cu interconnects on a semiconductor substrate 412. The metal interconnects 410 may be formed on the semiconductor substrate 412 e.g. by electroplating process. Subsequently, an underfill 414 is applied e.g. by spin coating or vacuum laminating on a surface 416 of the semiconductor substrate 412. Next, the underfill 414 is prebaked, such that the underfill 414 is partially cured. The prebaking process may also remove vaporizing chemicals in the underfill. Preferably, the underfill 414 is not fully cured during the prebaking process, so that the underfill 414 may maintain its adhesive properties, which is required for temporary bonding of the wafer 402 to the chips 404, 406, 408. Typically, the prebaking process is carried out before a surface planarization step. The wafer 402 is planarised adjacent the surface 416 by suitable techniques which include, but are not limited to, chemical-mechanical planarization, dry polishing and bit-grinding. As a result, the underfill 414 is flush with the metal interconnects 410, forming a planar surface 418 to receive the chips 404, 406, 408.

After the wafer 402 is planarised, the chips 404, 406, 408 are prepared by an additional dicing step, such that the wafer 402 is diced into individual chips 404, 406, 408.

In step 304, the wafer 402 and chips 404, 406, 408 undergoes a metal surface cleaning step. Suitable cleaning techniques include, but are not limited to, $H_2$ plasma cleaning, Ar plasma cleaning, wet chemical cleaning and gaseous chemical cleaning. Typically, the cleaning process is carried out by using $H_2$ plasma or gaseous formic acid. During this cleaning step, metal oxide on the electrodes may be removed.

Figure 4B:
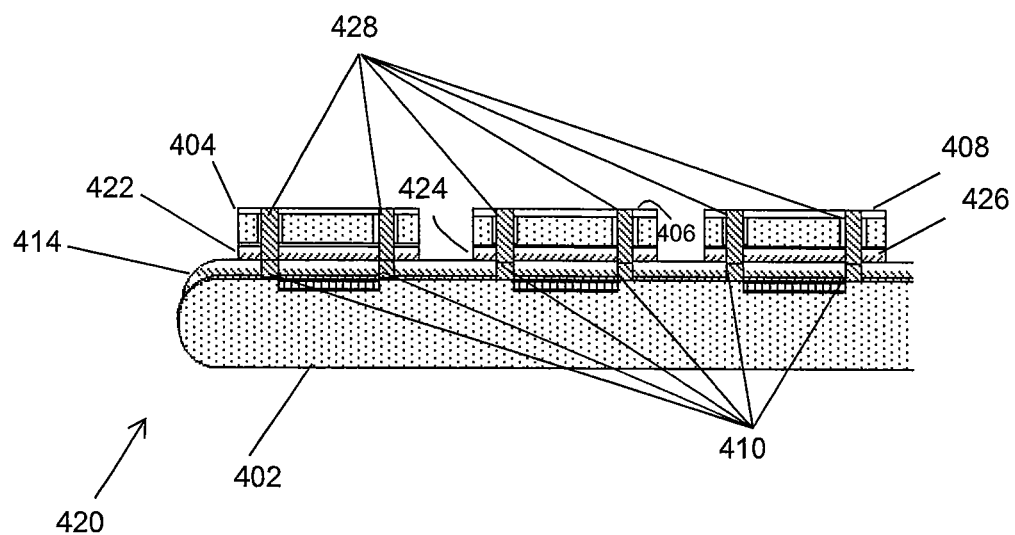
FIG. 4B shows a diagram illustrating a cross-sectional view of the at least one chip and wafer obtained from step 306 of FIG. 3 in accordance with the embodiment.

FIG. 4B shows a diagram illustrating a cross-sectional view of the at least one chip and wafer obtained from step 306 of FIG. 3 in accordance with the embodiment. Here, the chips 404, 406, 408 are placed on the wafer 402, forming an integrated product 420, as described with respect to FIG. 3. In a preferred embodiment, the step 306 is carried out by a flip chip bonder. The step 306 may be carried out by first aligning the chips 404, 406, 408 on the wafer 402. The chips 404, 406, 408 are then temporarily bonded to the wafer 402 to form the integrated product 420. Typically, the temporary bonding process is carried out at a temperature lower than 100° C., with the underfill 414 on the wafer 402 temporarily bonded to an underfill layer on the chips 404, 406, 408, schematically represented as underfill 422, 424, 426. As a result, the metal interconnects 410 of the wafer 402 are aligned to and in physical contact with corresponding metal interconnects of the chips 404, 406, 408, schematically represented as metal interconnects 428. Other substances may also be used to temporarily bond the chips 404, 406, 408 to the wafer 402, as will be understood by a person skilled in the art.

Figure 4C:
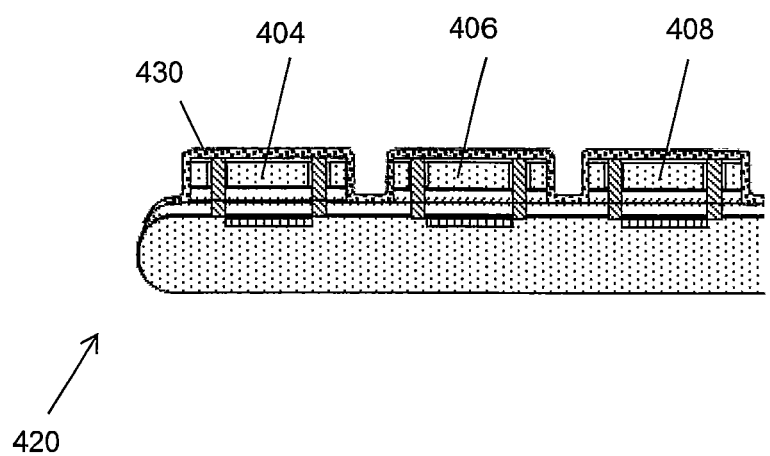
FIG. 4C shows a diagram illustrating a cross-sectional view of the at least one chip and wafer obtained from step 308 of FIG. 3 in accordance with the embodiment.

FIG. 4C shows a diagram illustrating a cross-sectional view of the at least one chip and wafer obtained from step 308 of FIG. 3 in accordance with the embodiment. Here, a film, in the form of a dummy film 430, is formed on the integrated product 420, such that the integrated product 420 is substantially fluid-tight, as described with respect to FIG. 3. In an embodiment of the invention, the dummy film 430 may be coated on the integrated product in a vacuum chamber, thereby making the integrated product 420 vacuum sealed, i.e. substantially fluid-tight with no air cavities between the dummy film 430 and the integrated product 420. In an alternate embodiment, the dummy film 430 is first coated on the integrated product, followed by an additional step of removing trapped gas between the dummy film 430 and the integrated product 420, e.g. by removing the trapped gas in a vacuum chamber. Preferably, the dummy film 430 is spray-coated on the integrated product 420. Next, the dummy film 430 is cured e.g. by UV radiation. The dummy film 430 may also be thermally cured at as low a temperature as practicable. In alternate embodiments, the dummy film 430 may be formed on the integrated product 420 using other methods, as will be appreciated by a person skilled in the art. For example, the dummy film 430 may be formed on the integrated product 420 by depositing the dummy film 430 on the integrated product, followed by a step of removing trapped gas between the dummy film 430 and the integrated product 420. This embodiment will be discussed in further detail with reference to FIG. 7.

It will be appreciated that other techniques may also be used to coat the dummy film 430 on the integrated product 420. Typically, the thickness of the dummy film 430 ranges from 10 micron to 1 mm. The properties of the dummy film 430 include, but are not limited to, curable with a temperature below 50° C. or if possible, without being heated, not porous after curing, and a working temperature higher than a temperature for bonding of the wafer 402 and the chips 404, 406, 408. Suitable material of the dummy film 430 includes, but is not limited to, Dow Corning X3-6211. Other materials may also be used to form the dummy film 430, as will be understood by a person skilled in the art.

Figure 5:
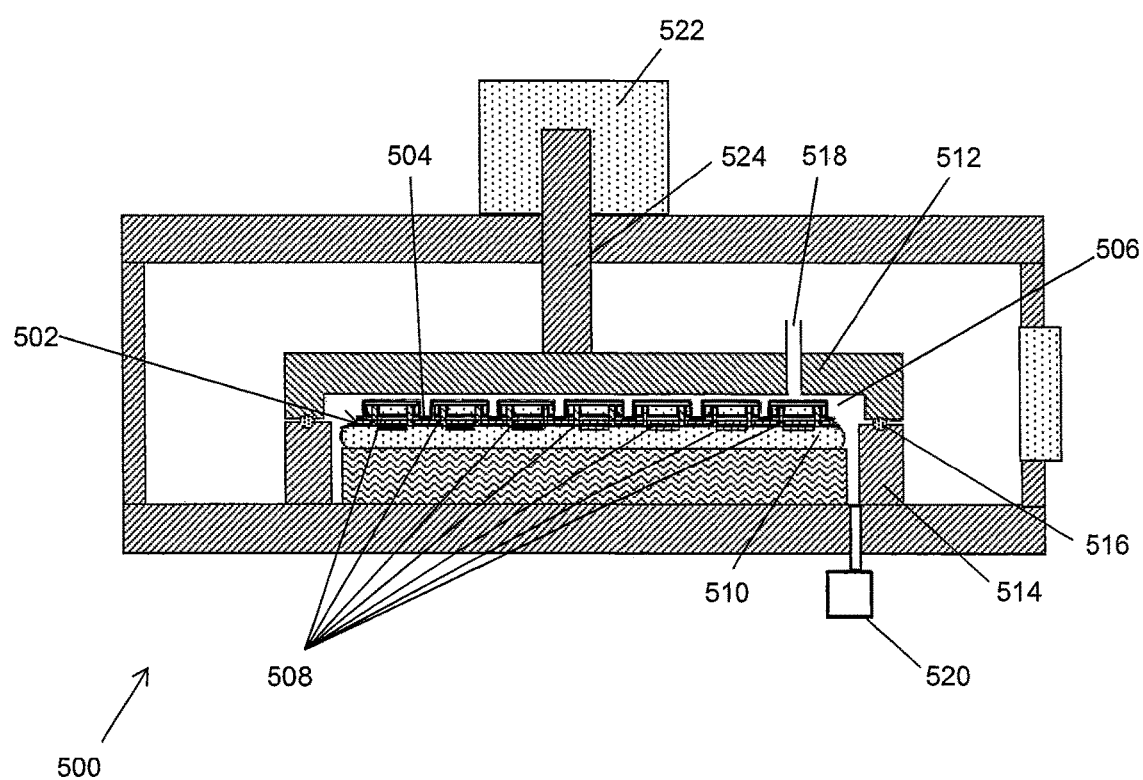
FIG. 5 shows a diagram illustrating a cross-sectional view of a gang bonding system for use in step 310 of FIG. 3, including at least one chip and wafer inside.

FIG. 5 shows a diagram illustrating a cross-sectional view of a gang bonding system 500 for use in step 310 of FIG. 3, including at least one chip and wafer inside. In the example shown in FIG. 5, an integrated product 502 with a dummy film 504 on a surface thereof is placed in a bond chamber 506 of the gang bonding system 500 for a permanent bonding process of a plurality of chips, schematically represented as chips 508 to the wafer 510. The gang bonding system 500 comprises a top stage 512, a bottom stage 514 and an O-ring 516 on a surface thereof, a gas inlet 518, a vacuum system 520 and a force application unit 522 connected to the top stage 512 via a piston 524, for controlling the top stage 512. During the permanent bonding process, the top stage 512 moves down applying a force on the O-ring 516 of the bottom stage 514, such that the bonding chamber 506 is substantially fluid-tight. Subsequently, the vacuum system 520 may be actuated to remove trapped gas in the bonding chamber 506.

Next, a predetermined positive pressure is exerted on the dummy film 504 by introducing a gas with a suitable pressure into the bonding chamber 506 via the gas inlet 518. In some embodiments, during the permanent bonding process, the gas pressure in the bonding chamber 506 can be increased to as high as ten times atmospheric pressure. The top stage 512 is configured to press on the O-ring 516 such that the abutment of the top stage 512 to the O-ring 516 can prevent or substantially reduce leaking of gas from the bonding chamber 506. Preferably, the bonding system 500 is made of a rigid material, e.g. stainless steel, which can withstand the pressure built up inside the bonding chamber 506.

At the same time, a temperature of the integrated product 502 is regulated to a bonding temperature. In an implementation, the temperature of the integrated product 502 may be regulated by increasing gas temperature around the integrated product 502 to the bonding temperature. For example, the gas temperature around the integrated product 502 may be increased by introducing gas with the bonding temperature into the bonding chamber 506, increasing temperatures of the top stage 512 and bottom stage 514 or actuating a heater (not shown) in the bonding chamber 506. In an alternate embodiment, the temperatures of the top stage 512 and bottom stage 514 may be increased e.g. by an embedded heater (not shown), thereby heating the integrated product 502 to the bonding temperature. It will be appreciated by a person skilled in the art that different permutations and combinations of methods to regulate the temperature of the integrated product 502 are possible, and the above-described configurations are some of the examples.

The pressure in the bonding chamber 506 and temperature of the integrated product 502 is maintained for a predetermined period of time, until the permanent bonding process is completed. Typically the permanent bonding process takes about thirty minutes. The pressure in the bonding chamber 506 and the temperature of the integrated product 502 is then lowered.

Figure 6:
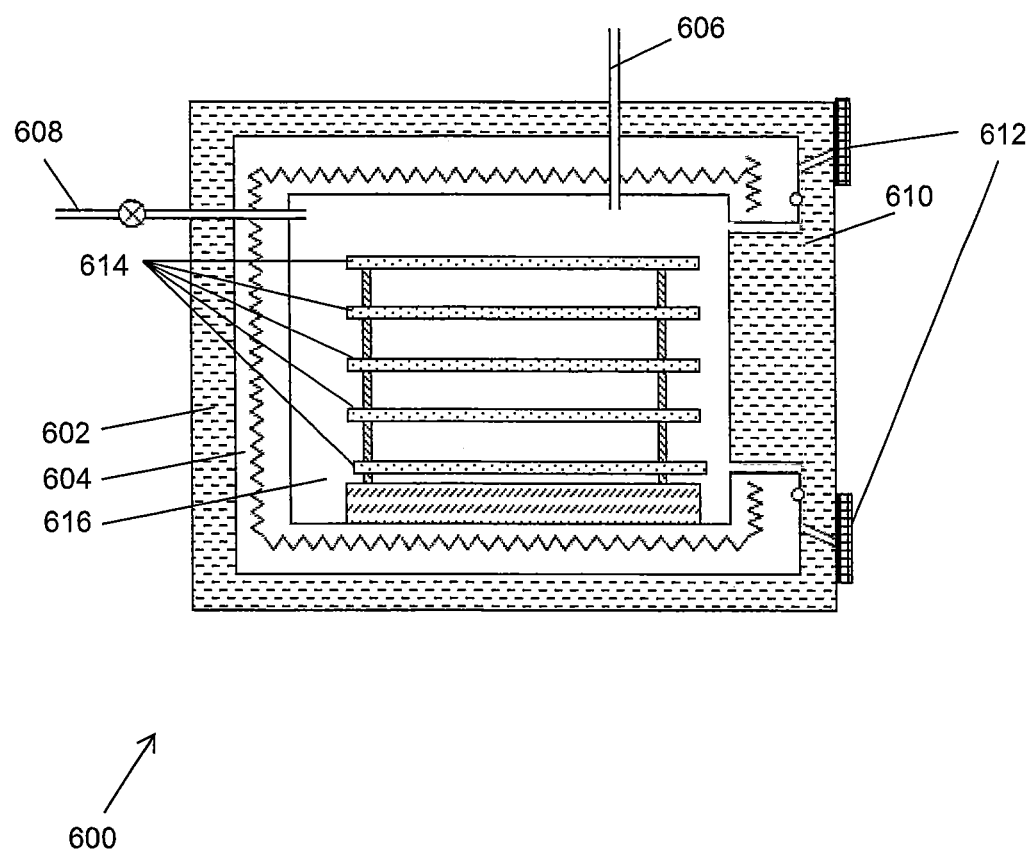
FIG. 6 shows a diagram illustrating a cross-sectional view of another gang bonding system for use in step 310 of FIG. 3.

FIG. 6 shows a diagram illustrating a cross-sectional view of another gang bonding system 600 for use in step 310 of FIG. 3. In the example shown in FIG. 6, the gang bonding system 600 comprises a chamber wall 602 with a heater 604 inside, a gas inlet 606, a gas outlet 608, a door 610 with door locks and a plurality of stages, schematically represented as stages 614.

At step 310, at least one integrated product is placed on the stages 614 and the door 610 is closed and locked, such that a bonding chamber 616 which is fluid-tight is formed. The pressure of the bonding chamber 616 is then increased to a predetermined positive pressure by introducing a gas with a suitable pressure through the gas inlet 606. At the same time, the temperature of the bonding chamber 616 is also increased to a bonding temperature using the heater 604. At step 310, the conditions of the bonding system 600 and the integrated product are brought to a condition similar to that described with respect to FIG. 5, until the permanent bonding process is complete. Similarly, the components of the bonding system 600 are made of a rigid material, e.g. stainless steel, which can withstand the pressure built up inside the bonding chamber 616. It should be noted that, in contrast with the bonding system 500 as illustrated in FIG. 5, the bonding system 600 as illustrated in FIG. 6 does not comprise a force application unit and piston, thereby having a relative simpler configuration. Further, the bonding system 600 with its plurality of stages 614 facilitates multiple wafer processing.

After the permanent bonding process as described above with respect to FIGS. 5 and 6, the dummy film 504 is removed from the integrated product 502. Typically, the process of removing the dummy film 504 from the integrated product 502 comprises the steps of first placing the integrated product 502 with the dummy film 504 thereon in a spinning member, followed by adding a chemical solvent onto the film. After removing the dummy film 504, the integrated product 502 is dried and placed into a cassette.

Figure 7:
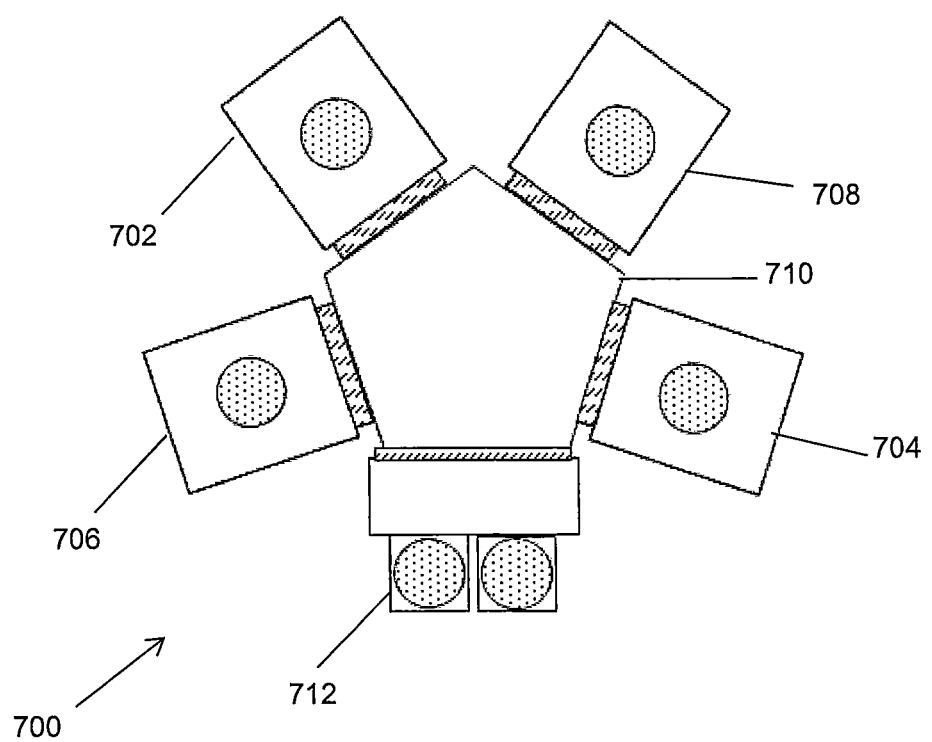
FIG. 7 shows a diagram illustrating an apparatus for chip-to-wafer integration according to the example embodiment.

FIG. 7 shows a diagram illustrating an apparatus 700 for chip-to-wafer integration according to the example embodiment. The apparatus 700 comprises a coating module 702 for forming a film on an integrated product, wherein the integrated product is formed by placing at least one chip onto a wafer, such that the integrated product is substantially fluid-tight. The apparatus 700 further comprises a film baking module 704 for curing the film. The apparatus 700 also comprises a bond module 706 for exerting pressure on the film during permanent bonding of the at least one chip to the wafer. The apparatus 700 also comprises a cleaning module 708 for removing the film from the integrated product. Further, the apparatus 700 in example shown in FIG. 7 also comprises a transfer module 710 for shifting the integrated product. The apparatus 700 further comprises a wafer cassette 712 for placement of the integrated product.

Figure 8:
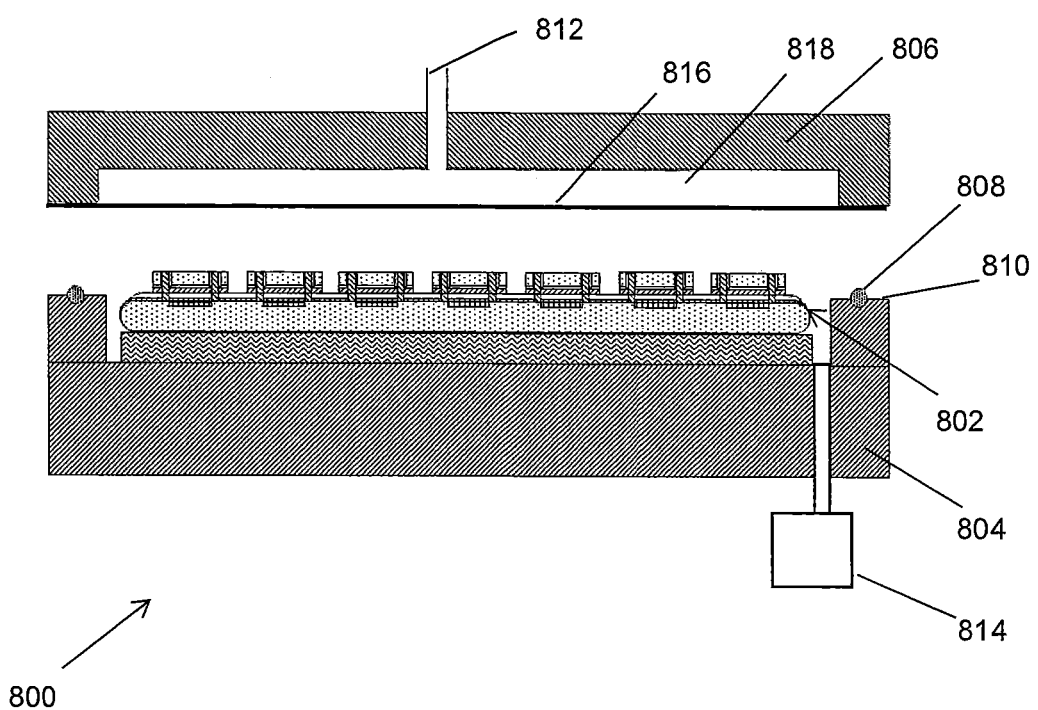
FIG. 8 shows a diagram illustrating a cross-sectional view of a bonding system for use in steps 308, 310, 312 of FIG. 3, including at least one chip and wafer inside.

FIG. 8 shows a diagram illustrating a cross-sectional view of a bonding system 800 for use in steps 308, 310, 312 of FIG. 3, including at least one chip and wafer inside. In the example shown in FIG. 8, an integrated product 802 is placed in a bottom stage 804 of the bonding system 800. The bonding system 800 further comprises a top stage 806, an O-ring 808 on a protruded surface 810 of the bottom stage, a gas inlet 812, a vacuum system 814 and a film 816 attached to the top stage 806, thereby forming a fluid-tight cavity 818 between the top stage 806 and the film 816. The height of the cavity 818 typically ranges from 0.5 mm to 10 mm. The film 816 is made of material that can withstand a bonding temperature when the permanent bonding process is carried out, wherein the bonding temperature is usually more than 200° C. Suitable materials include, but are not limited to, thermo-plastics, Kapton and silicon rubber. The thickness of the thin film can range from 10 microns to 2 mm.

At step 308, the top stage 806 moves down and applies a force on the O-ring 808 to form a bonding chamber that is substantially fluid-tight. At this point, the film 816 is deposited on the integrated product 802. Subsequently, the vacuum system 814 is actuated to remove trapped gas between the film 816 and integrated product 802, such that the integrated product is substantially fluid-tight.

At step 310, a predetermined positive pressure is exerted on the film 816 by introducing a gas with a suitable pressure into the cavity 818 via the gas inlet 812. Further, the top stage 806 and bottom stage 804 with embedded heater (not shown) are heated to a bonding temperature. The conditions of the bonding system 800 and the integrated product 802 are brought to a condition similar to that described with respect to FIG. 5, until the permanent bonding process is complete.

Figure 9:
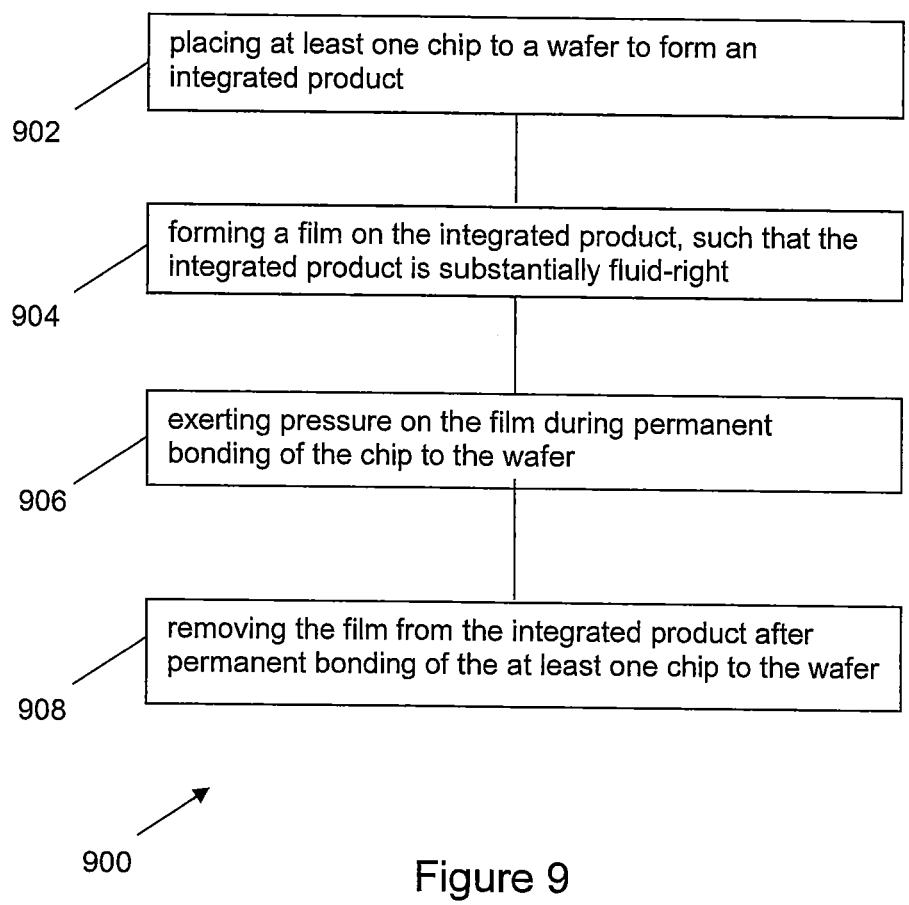
FIG. 9 shows a flow chart illustrating a method for chip-to-wafer integration according to the present embodiment.

FIG. 9 shows a flow chart 900 illustrating a method for chip-to-wafer integration according to a further embodiment. At step 902, at least one chip is placed on a wafer to form an integrated product. At step 904, a film is formed on the integrated product, such that the integrated product is substantially fluid-tight. At step 906, permanent bonding is carried out by exerting a predetermined positive pressure on the film and regulating a temperature of the integrated product. At step 908, the film is removed from the integrated product after permanent bonding of the at least one chip to the wafer.

Embodiments of the present invention provide a method for chip-to-wafer integration that exerts pressure on a film during permanent bonding of a chip to a wafer using gas as the medium. As a result, each chip can receive sufficient bonding force regardless of the heights of the chips. Further, each chip may receive uniform pressure on the surface of the chips. As a result, misalignment of chips with the wafer during permanent bonding may be avoided.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method for chip-to-wafer integration, the method comprising the steps of:
    placing at least one chip on a wafer to form an integrated product;
    forming a film on the integrated product, such that the film over the integrated product is substantially fluid-tight;
    exerting a predetermined positive pressure on the film during permanent bonding of the at least one chip to the wafer; and
    removing the film from the integrated product after permanent bonding of the at least one chip to the wafer.

2. The method as claimed in claim 1, further comprising the step of:
    regulating a temperature of the integrated product during permanent bonding of the at least one chip to the wafer.

3. The method as claimed in claim 1, wherein placing the at least one chip to the wafer comprises the steps of:
    aligning the at least one chip to the wafer; and
    temporarily bonding the at least one chip to the wafer to form the integrated product.

4. The method as claimed in claim 1, wherein forming the film on the integrated product comprises:
    spray-coating the film on the integrated product in a vacuum chamber; and
    curing the film on the integrated product in the vacuum chamber.

5. The method as claimed in claim 1, wherein forming the film on the integrated product comprises the steps of:
    spray-coating the film on the integrated product;
    curing the film; and
    removing trapped gas between the cured film and the integrated product.

6. The method as claimed in claim 1, wherein forming the film on the integrated product comprises the steps of:
    depositing the film on the integrated product;
    curing the film; and
    removing trapped gas between the cured film and the integrated product.

7. The method as claimed in claim 1, wherein exerting pressure on the film comprises increasing gas pressure on the film to a predetermined positive pressure.

8. The method as claimed in claim 1, wherein removing the film from the integrated product comprises the steps of:
    placing the integrated product with the film thereon in a spinning member; and
    adding chemical solvent onto the film.

9. The method as claimed in claim 2, wherein regulating the temperature of the integrated product comprises increasing gas temperature around the integrated product to a bonding temperature.

10. The method as claimed in claim 5, wherein the curing step comprises curing the film at a temperature of 50° C. or less.

11. The method as claimed in claim 10, wherein the curing step comprises curing the film without heating it.

12. The method as claimed in claim 6, wherein the curing step comprises curing the film at a temperature of 50° C. or less.

13. The method as claimed in claim 10, wherein the curing step comprises curing the film without heating it.

14. The method as claimed in claim 5, wherein the spray-coating step comprises spray-coating the film on the integrated product to a thickness of between ten microns and two millimeters.

15. The method as claimed in claim 14, wherein the spray-coating step comprises spray-coating the film on the integrated product to a thickness of between ten microns and one millimeter.

16. The method as claimed in claim 6, wherein the deposition step comprises depositing the film on the integrated product to a thickness of between ten microns and two millimeters.

17. The method as claimed in claim 16, wherein the deposition step comprises depositing the film on the integrated product to a thickness of between ten microns and one millimeter.

18. The method as claimed in claim 1, wherein the step of forming the film comprises forming the film on the integrated product from a material which is not porous after curing and which has a working temperature after curing greater than 200° C., such that the film over the integrated product is substantially fluid-tight.

* * * * *